United States Patent [19]

Langenwalter et al.

[11] Patent Number: 4,656,352

[45] Date of Patent: Apr. 7, 1987

[54] OPTOELECTRONIC TRANSDUCER

[75] Inventors: Michael Langenwalter, Stockdorf; Lothar Später, Annweiler, both of Fed. Rep. of Germany

[73] Assignee: Siemens Aktiengesellschaft, Berlin and Munich, Fed. Rep. of Germany

[21] Appl. No.: 771,738

[22] Filed: Sep. 3, 1985

[30] Foreign Application Priority Data

Sep. 24, 1984 [DE] Fed. Rep. of Germany ........ 3435013

[51] Int. Cl.⁴ .............................................. H01J 5/16
[52] U.S. Cl. ................................... 250/227; 350/96.20
[58] Field of Search ............... 250/227, 551; 350/96.2, 350/96.17; 455/610, 612

[56] References Cited

U.S. PATENT DOCUMENTS

| | | | |
|---|---|---|---|
| 4,268,113 | 5/1981 | Noel, Jr. ................ | 350/96.20 |
| 4,307,935 | 12/1981 | Monnier ................ | 350/96.20 |
| 4,316,204 | 2/1982 | Inagaki et al. ......... | 350/96.2 X |
| 4,553,811 | 11/1985 | Becker et al. .......... | 350/96.20 |

FOREIGN PATENT DOCUMENTS

| | | |
|---|---|---|
| 0054300 | 6/1982 | European Pat. Off. . |
| 0078364 | 5/1983 | European Pat. Off. . |
| 0111263 | 8/1984 | European Pat. Off. . |
| 3311038 | 9/1984 | Fed. Rep. of Germany . |
| 3429282 | 4/1985 | Fed. Rep. of Germany . |
| 3429234 | 4/1985 | Fed. Rep. of Germany . |
| 82/02800 | 8/1982 | PCT Int'l Appl. . |

OTHER PUBLICATIONS

U.S. Ser. No. 659,892.
U.S. Ser. No. 704,332.
"Photodioden als optische Empfaenger fuer Lichtwellenleiter-Übertragungs systeme", Plihal et al., pp. 97 to 101, Telcom Report 6 (1983).

Primary Examiner—Eugene R. LaRoche
Assistant Examiner—James C. Lee
Attorney, Agent, or Firm—Jeffrey P. Morris

[57] ABSTRACT

An optoelectronic transducer for the conversion of lightwaves to electrical voltage or current, or of voltage or current to lightwaves is disclosed, the transducer comprising a fiber optical system (K, L), a support (T) on which an optoelectronic structural element (D) with at least first and second electric leads (E1/D1, E2/D2/DD) is fastened, and a hole (LO) through the support (T) so arranged that the optically active point of the structural element (D) is directed onto the fiber optical system (K, L) across the hole, the hole wall having a metallic coating (DD) which in operation constitutes a section of the first lead of the structural element (D), the first lead capable of sustaining high speed data transmission.

10 Claims, 3 Drawing Figures

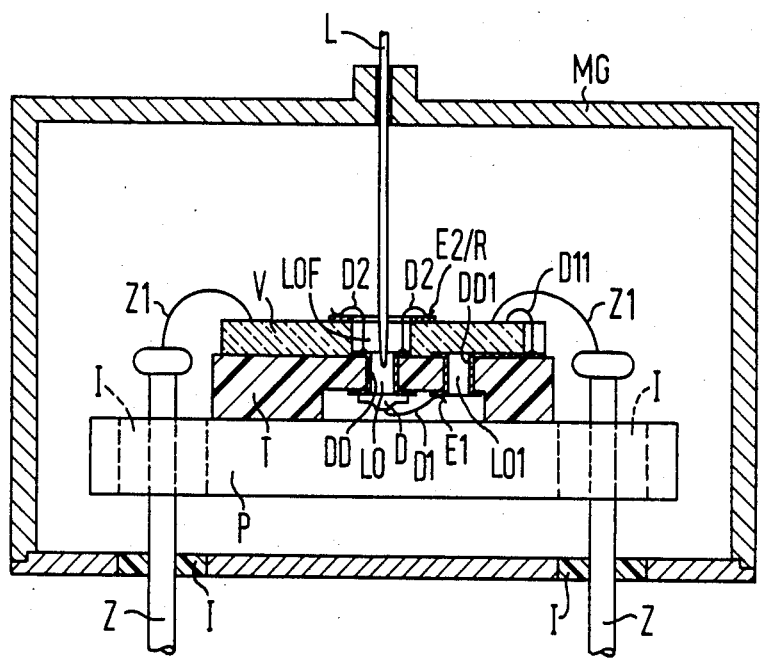

1

OPTOELECTRONIC TRANSDUCER

BACKGROUND OF THE INVENTION

1. Technical Field

This invention relates to the field of optoelectronic transducers and, more particularly, to improving the data transmission rate of such transducers.

DESCRIPTION OF THE PRIOR ART

Exemplary optoelectronic transducers are known which represent the present state of the art of such devices as, for example, represented by the transducer described in U.S. patent application, Ser. No. 551,522 which corresponds to DE-OS 32 44 882, and shown there in FIGS. 2, 3 and 5. Similar arrangements can also be learned from the older but not yet published U.S. patent application Ser. No. 659,892 which corresponds to DE-OS 33 37 131, and Ser. No. 704,332 which corresponds to DE-OS 34 06 424.

Actually the present invention was developed as a variant of the optoelectronic arrangements described in the U.S. patent application Ser. No. 704,332, FIG. 2, so that in principle the present invention could be implemented as an improvement to those arrangements furthermore, the disclosure of all of the above-described applications are to be regarded as incorporated herein by reference to their full extent. However, the present invention is applicable moreover to other optoelectronic transducer embodiments that are also known and is consequently not limited in its scope to these.

It is the object of the present invention both to further increase the upper limit data transmission rate of the transducer, e.g. to far above 600 Mbits/sec, and yet to further reduce the light losses between the structural element and the fiber optical system to the greatest extent possible, or at least not cause any substantial adverse effect by increasing the upper limit of data transmission rate.

SUMMARY OF THE INVENTION

The problems and related problems of the prior art are solved by the changes suggested by the present invention. A metallic coating of the hole wall where transduction occurs serves on the one hand to accomplish the desired improvement in data transmission rate by realizing a low-selfinductance and often also a low-selfcapacitance in lead structures and to utilize this RF-favorable coating of the hole wall as a reflector for dispersed light in such a way that a reduction of the light losses is attainable despite the improvement in data transmission rate.

Additional measures suggested in achieving these objectives are to separate a second lead from a first lead capacitively and thereby reduce capacitive bridging of the component;

to structure the second lead also with low self-inductance and yet pass both leads to the surface of the support for the transducer away from the structural element;

to connect the second lead with the corresponding contact point of the structural element in an uncomplicated manner suitable for quantity production;

to connect the second lead with the corresponding contact point of the structural element in a particularly low-selfinductance manner;

to utilize the support at the same time as an amplifier which in turn amplifies electrically the signals optically transmitted or received by or from the structural element, as a preamplifier or postamplifier;

to reduce the circuit capacitance between the structural element and the leads, on the one hand, and the semiconductor body or amplifier, on the other hand, and thereby to further increase the data transmission rate of the arrangement; and to improve or to ensure the electrical shielding and mechanical stability of the arrangement, which generally requires a very high adjustment precision.

The principles of the present invention and its improvements will be further explained with reference to the embodiments shown schematically in the figures, the figures showing only schematically the most important parts of the invention for simplicity.

BRIEF DESCRIPTION OF THE DRAWINGS

FIG. 3 shows an example largely corresponding to FIG. 2, but where the self-capacitance of the structural element and (in particular of the first) leads to the amplifier chip is especially small, whereby an especially high data transmission rate is attainable.

DETAILED DESCRIPTION

All figures, therefore, show embodiments of the optoelectronic transducer according to the present invention for the conversion of light to voltage or current, or of voltage or current to light.

Figure 1:
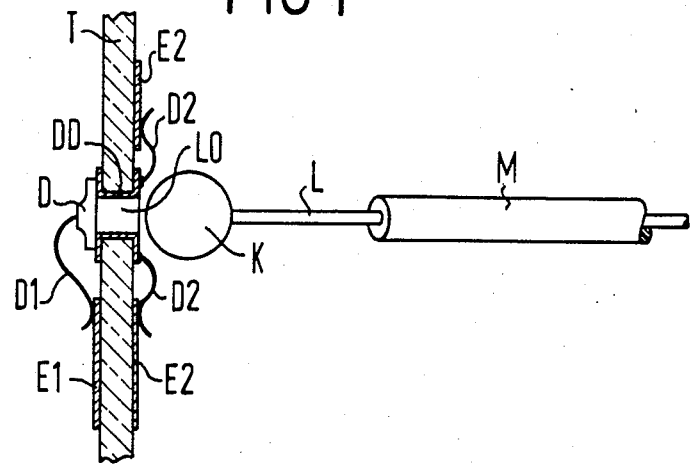
FIG. 1 shows the electrical and optical coupling of the structural element of the present optoelectronic transducer.
Figure 2:
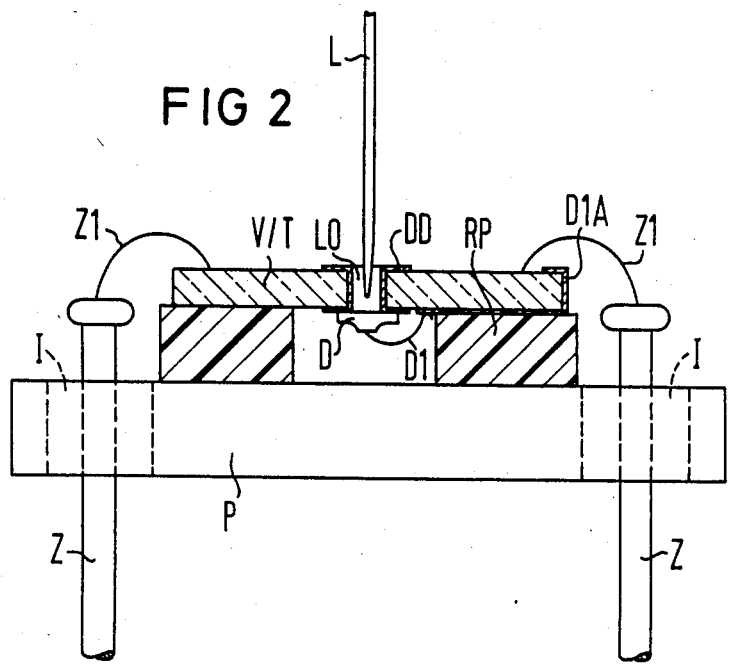
FIG. 2 shows another example of this coupling, with an especially short, low-selfinductance coupling of the structural element via its first lead to corresponding terminals of a support serving at the same time as amplifier.

All shown arrangements comprise a fiber optical system with a glass fiber L, this glass fiber L emitting or receiving light which is directed either, via a spherical lens K of FIG. 1 or, via a tip or so-called "taper" of FIGS. 2 and 3 onto an optically active point of a structural element D. This structural element D is applied always on the back of a support T, referred to the fiber optical system L, the support T having a hole LO across which the fiber optical system L is optically coupled with the optically active point of the structural element D. The structural element D, therefore, is fastened on the back of the support T at the hole LO.

The structural element D may be e.g. a solid state laser or a photo diode, e.g. an InGaAs/InP photo diode according to the article by Manfred Plihal et al. appearing in the Telcom Report 6 (1983) Supplement entitled "Communication transmission with light", pages 97 to 101, "Photodiodes in optical receivers for lightwave transmission systems."

The fiber optical system may in principle have any desired construction and may be rigidly coupled mechanically to the support T in any desired manner. In FIG. 1 a jacket M has been indicated only schematically for fiber L, and in FIG. 3, a metal housing MG is shown. In particular this metal housing MG may serve not only for electrical and optical shielding of the arrangement from interference factors from the surroundings, but also for the rigid mechanical connection between the support T and the fiber optical system L, in a similar manner as described in the above-cited patent applications.

A feature of all embodiments according to the present invention is that the wall of the hole LO has a metallic coating DD which serves as a section of the first electric lead, the first lead as shown in FIG. 1 consisting of several bonded solid wires D2 connected in parallel with one another from the large-area annular electrode E2 to the coating DD. In the embodiments shown in the figures, the structural element D has only two leads, the second lead being formed in FIG. 1 by the solid wire D1 and the large-area electrode E1. To reduce the self-inductance of the second lead and hence to increase the data transmission rate of the arrangement, a plurality of wires D1 connected in parallel with one another may be provided instead of a single wire D1.

The leads in FIGS. 2 and 3 are similarly constructed. The first lead in the example shown in FIG. 2 is formed solely by the coating DD of the hole wall, the lateral metallizations outside the hole serving on the one hand for contacting with the structural element D and on the other hand for the connection with transistors (not shown in the figure) of the amplifier chip V. The transistors of the amplifier chip V are supplied with corresponding potentials from the outside via wires Z1 and terminal pins Z, a part of these terminal pins Z being able to conduct also high-frequency currents. In the example shown in FIG. 2, therefore, the support D is formed by an amplifier chip or semiconductor chip V. The support T/amplifier chip V in turn rests by an annular insulator block RP of a base plate P, which may be for example of metal and may be part of a metal housing around the arrangement. Between the annular insulator block RP and the support T a metallization D1A is applied, which forms a section of the second lead to the structural element D and which in the example shown may be connected via one or more solid wires D1 to the structural element D by bonding. In the example shown, this metallization D1A is brought up around the edge of support T where a connection with transistors of the support T/amplifier chip V may be established. Such a metallization D1A forming a portion of the second lead has an especially low self-inductance and thus increases the data transmission throughout of the transducer.

In the example shown in FIG. 3, the semiconductor chip/amplifier chip V is applied on a support T formed by an insulator. The amplifier chip V as well as the support T have holes LO, LOF arranged in alignment with each other, the optical coupling between the structural element D and the fiber optical system L being arranged across the two holes. In the example shown in FIG. 3, the coating DD of the hole wall of support T is connected via a plurality of solid bond wires D2 connected in parallel with one another to an annular electrode around the aligned hole LOF of the semiconductor chip V, and the first lead therefore consists of this annular electrode R, which corresponds to electrode E2 in FIG. 1, the bond wires D2, and the metallic coating DD in hole LO of support T. The second lead of the structural element D consists in this example of one or more bond wires D1 connected in parallel with one another and a metal spot E1, which, if needed, is conductively connectable with a metallic coating DD1 of an additional hole LO1 of support T. The coating DD1 possibly applied all around hole LO1 serves e.g. for inductance reduction, this upwardly extending coating DD1 being electrically connectable, especially if the self-capacitance increase is deemed too unimportant, with the transistors of the semiconductor chip V via an additional metallization and via wires D11. In the example shown in FIG. 3, therefore, the second lead consists of bond wires D11, of metallization also extending through the hole LO1, and of bond wires D1.

For the rest, FIG. 3 shows as a rough example that the terminal pins Z brought out under insulation by means of insulators I constitute the electrical connections of the transducer disposed inside the metal housing MG. This metal housing MG serves for the optical and electrical shielding of the arrangement against influences from the environment as well as for long-term stabilization of the optical coupling adjusted for highest data throughout between the fiber optical system L and the structural element D.

The support T shown in FIG. 3 as well as the annular block RP shown in FIG. 2 and the support T shown in FIG. 1 may alternatively be formed by an aluminum oxide $Al_2O_3$ substrate composition. The holes LO, LOF ane LO1, can be drilled e.g. by a laser. Especially if the support is a semiconductor chip, as for example, shown in FIG. 2, the hole can be made with other means of high precision such as by etching.

The metallic coating DD, also DD1, and also the metallizations E1, E2, D1A, R may be produced e.g. by screen printing, or vacuum screen printing, and, in the case of a silicon substrate, by epitaxy.

The semiconductor chip V, referring in particular to FIGS. 2 and 3, can, despite the metallic coating of its hole wall, be tested separately inside the transducer, regardless of whether the structural element D is already mounted or not. Also the structural element D is in principle testable after its mounting independently of the semiconductor chip V, this being important in particular for the arrangement shown in FIGS. 2 and 3 because in these figures element D is physically difficult to reach after application of plate P.

Referring to FIG. 3, the metallic coating in hole LO and any metallic coating applied in the aligned hole LOF, will also have light-reflecting properties so that dispersed light losses can in principle be reduced, if necessary. In fact, if all metallic coatings in these hole walls fully line the holes all around, the light reflection at these coatings is especially great.

In all examples shown in the figures, the second lead, cf. E1/D1, to the structural element D is applied on (or over) the rear surface of the support T toward element D. The capacitance between the two leads can thus be made smaller than if the two leads were close together on the support surface away from element D.

Referring to FIGS. 1 and 3, the connecting wires D1 and the connecting wires D2, should be as short as possible, to minimize the self-capacitance and self-inductance of these wires. The self-inductance of these wires can be further reduced by using several such wires connected in parallel with one another.

Thus the present invention permits obtaining especially low self-inductances (and self-capacitances) of the leads further contributing to the especially high data transmission rate practically achievable.

What is claimed is:

1. An optoelectronic transducer for converting light waves to electrical voltage or current, or electrical voltage or current to light, the transducer comprising:
    (a) a fiber optic system including a glass fiber having an emitting/receiving end;
    (b) a support on which is fastened an optoelectronic structural element with at least first and second electrical leads; and (c) a hole through the support, the optically active point of the structural element being directed toward the fiber optic system through the hole, wherein the hole wall has a metallic coating which consists of a section of the first lead of the structural element, said first lead being adapted for conducting high-frequency signals, and wherein said support is comprised of a semiconductor chip.

2. The optoelectronic transducer according to claim 1, wherein the coating fully lines the hole.

3. The optoelectronic transducer according to claim 1, wherein said support includes a rear surface, and the second lead to the structural element is applied on the rear surface of the support toward the structural element.

4. The optoelectronic transducer according to claim 3, wherein the support has a second hole with a metallic coating which forms a section of the second lead.

5. The optoelectronic transducer according to claim 3, further comprising a solid connecting wire for the final connection to the respective contact point of the structural element.

6. The optoelectronic transducer according to claim 5 further comprising a plurality of connecting wires electrically connected in parallel with one another for the final connection of the second lead to the contact point of the structural element.

7. The optoelectronic transducer according to claim 1, wherein the support and the structural element are disposed in the interor of a metal housing having electrically insulated lead pins and an opening for the passage of the fiber optical system.

8. An optoelectronic transducer according to claim 1 further including a lens disposed at the emitting/receiving end of said glass fiber.

9. An optoelectronic transducer according to claim 1 wherein the emitting/receiving end of said glass fiber is tapered.

10. An optoelectronic transducer for converting light waves to electrical voltage or current, or electrical voltage or current to light, the transduer comprising:
 (a) a fiber optic system including a glass fiber;
 (b) a support on which is fastened an optoelectronic structural element with at least first and second electrical leads; and
 (c) a hole through the support, the optically active point of the structural element being directed toward the fiber optic system through the hole;

wherein the hole wall has a metallic coating which consists of a section of the first lead of the structural element, said first lead being adapted for conducting high-frequency signals, wherein the support is an insulator plate on which a semiconductor chip having a hole therein is fastened to a surface away from the structural element such that the hole in the support is aligned with the hole in the semiconductor chip.

* * * * *